United States Patent
Okamoto et al.

(10) Patent No.: US 8,790,851 B2
(45) Date of Patent: Jul. 29, 2014

(54) MASK AND METHOD FOR FABRICATING SEMICONDUCTOR DEVICE

(75) Inventors: Yosuke Okamoto, Mie (JP); Kazutaka Ishigo, Mie (JP); Taketo Kuriyama, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/569,860

(22) Filed: Aug. 8, 2012

(65) Prior Publication Data

US 2013/0252429 A1 Sep. 26, 2013

(30) Foreign Application Priority Data

Mar. 22, 2012 (JP) ................................. 2012-065382

(51) Int. Cl.
*G03F 1/42* (2012.01)

(52) U.S. Cl.
USPC ................................................ 430/5; 430/22

(58) Field of Classification Search
USPC .................... 430/5, 311, 312, 319, 22; 355/53
See application file for complete search history.

(56) References Cited

U.S. PATENT DOCUMENTS

| | | | |
|---|---|---|---|
| 2001/0055720 A1 | 12/2001 | Sato et al. | |
| 2007/0026543 A1 | 2/2007 | Sato | |
| 2008/0206898 A1 | 8/2008 | Fukuhara et al. | |
| 2008/0225254 A1* | 9/2008 | Komine et al. | .................. 355/53 |
| 2009/0153861 A1 | 6/2009 | Musa et al. | |

FOREIGN PATENT DOCUMENTS

| | | |
|---|---|---|
| JP | 7-94581 | 4/1995 |
| JP | 9-134888 | 5/1997 |
| JP | 2002-64055 | 2/2002 |
| JP | 2006-126614 | 5/2006 |
| JP | 2006-293081 | 10/2006 |
| JP | 2008-235715 | 10/2006 |
| JP | 2007-35768 | 2/2007 |
| JP | 2008-225224 | 9/2008 |
| JP | 2008-235715 | 10/2008 |
| JP | 2009-147328 | 7/2009 |

OTHER PUBLICATIONS

Office Action issued Jun. 10, 2014, in Japanese Office Action No. 2012-065382 (with English-language translation).

* cited by examiner

*Primary Examiner* — Stephen Rosasco
(74) *Attorney, Agent, or Firm* — Oblon, Spivak, McClelland, Maier & Neustadt, L.L.P.

(57) ABSTRACT

A photo mask for exposing according to an embodiment includes a mark pattern arranged in a mark region that is different from an effective region to form a semiconductor device; and a regular pattern arranged in the mark region and around the mark pattern and smaller than the mark pattern in size and pitch.

13 Claims, 14 Drawing Sheets

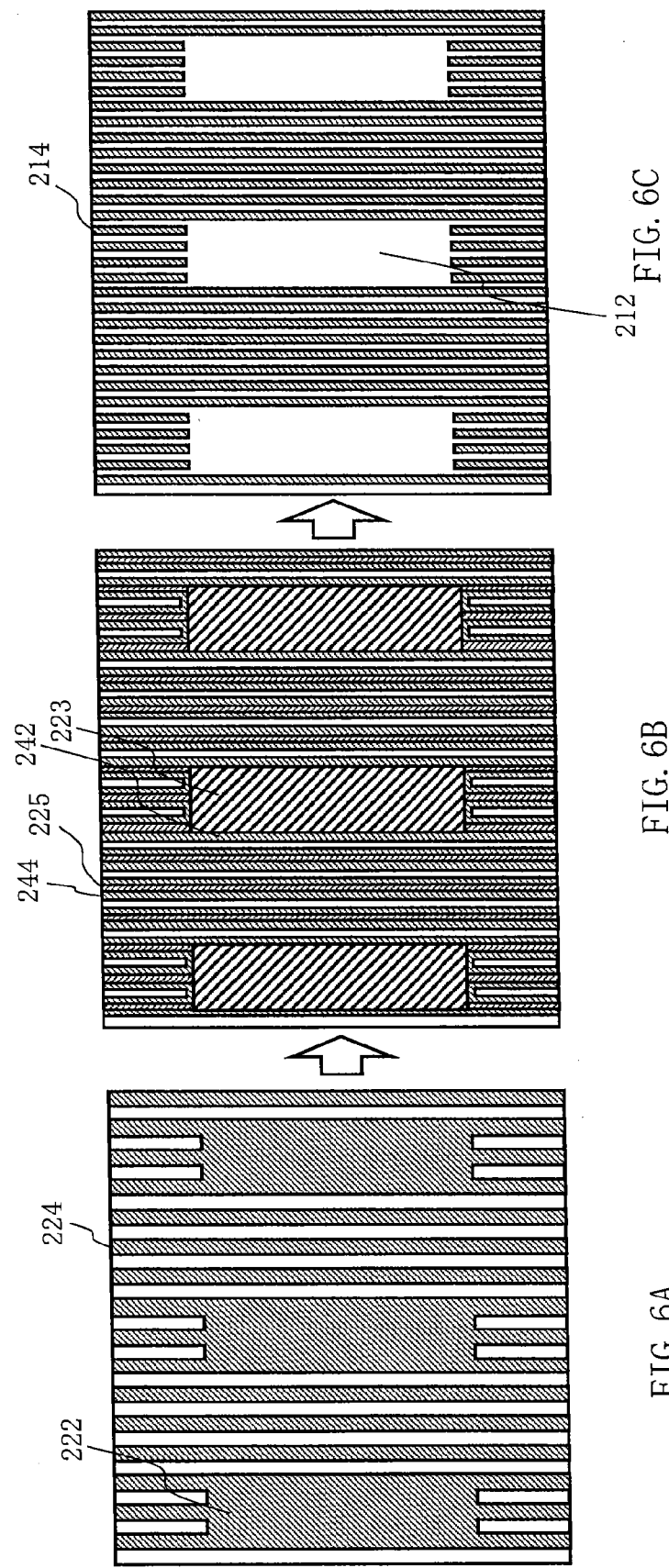

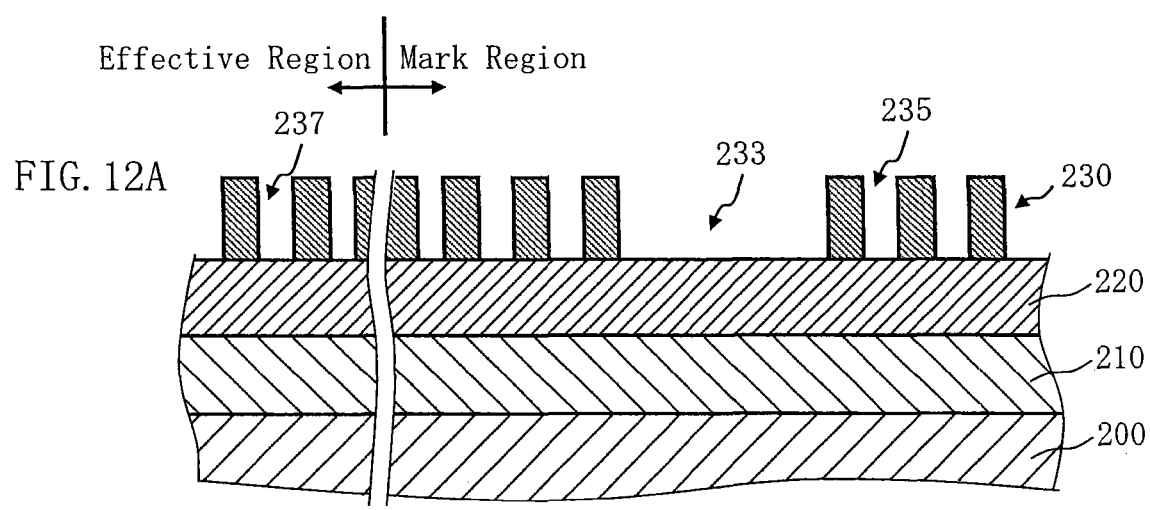
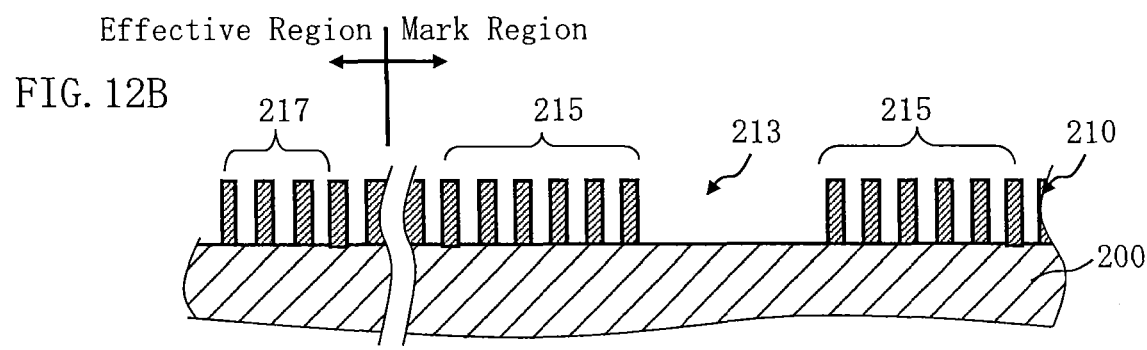

Optical Image
(Mark Portion
Section)

Diffracted Light Intensity Is Low And Margin Is Narrow

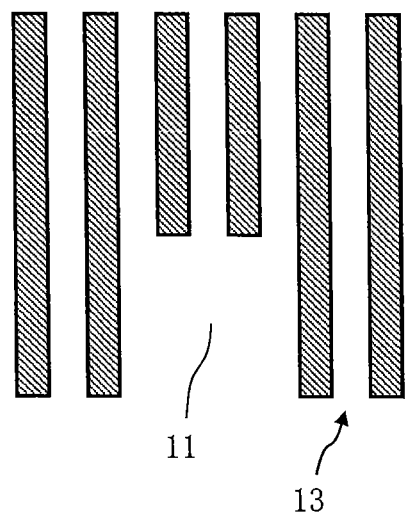
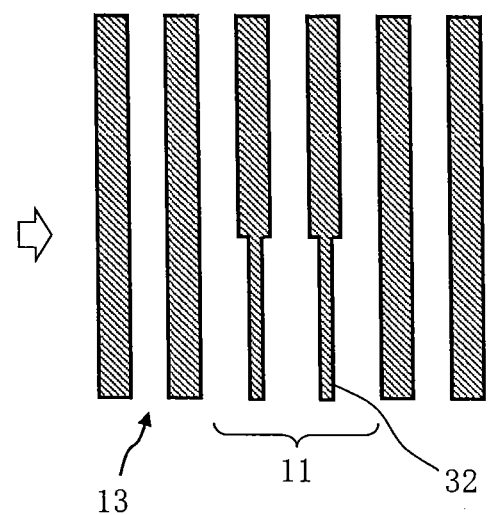
FIG. 16A         FIG. 16B
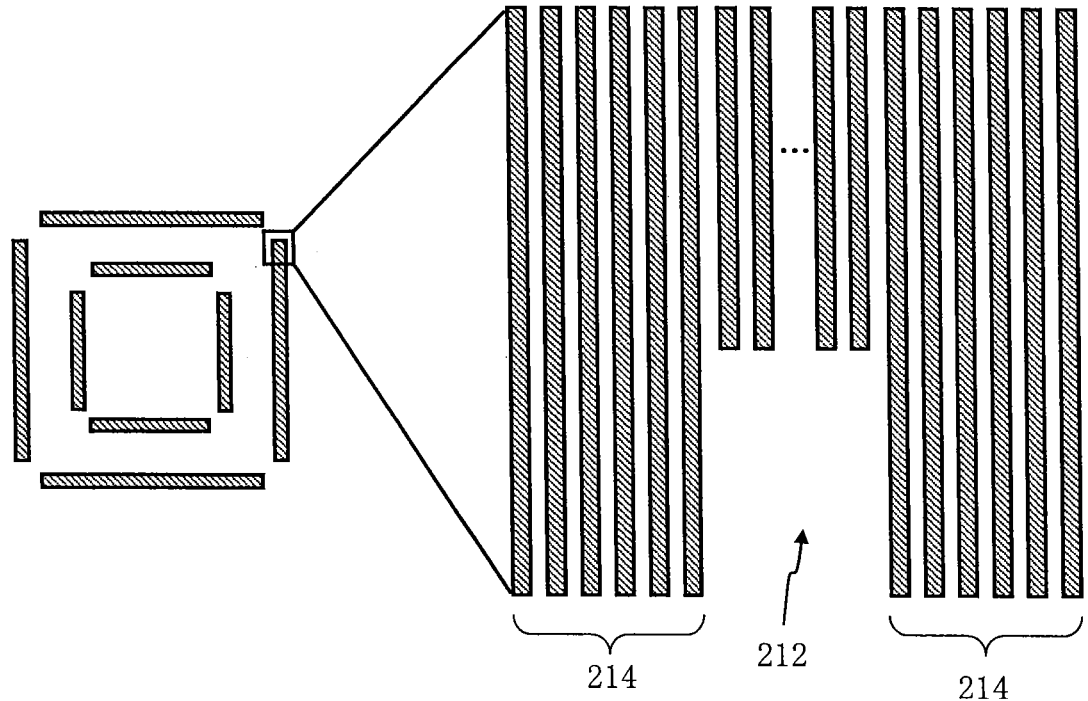
FIG. 17

MASK AND METHOD FOR FABRICATING SEMICONDUCTOR DEVICE

CROSS-REFERENCE TO RELATED APPLICATION

This application is based upon and claims the benefit of priority from Japanese Patent Application No. 2012-065382 filed on Mar. 22, 2012 in Japan, the entire contents of which are incorporated herein by reference.

FIELD

Embodiments described herein relate generally to a mask and a method for fabricating a semiconductor device.

BACKGROUND

In a semiconductor fabrication process using an exposure device, alignment with an alignment mark formed in a previous process is performed and a pattern for the next layer is exposed thereon. Then, superposition deviations between the exposed pattern and a substrate are measured from an image capturing a superposition measuring mark formed in the previous process and a superposition measuring mark of the exposed pattern simultaneously. Visible light or light in a long wavelength region is generally used for alignment and superposition measurement. Various patterns are used as the alignment mark or the superposition measuring mark and representative examples include the box in box type, bar in bar type, and line and space type. When designing these marks, the mark dimensions, densities, coverage, convex marks, concave marks, and segment marks are adjusted and selected so that a sufficient margin can be left for exposure conditions (exposure value, focus) for a device pattern.

In recent years, however, with increasingly finer patterns of semiconductor devices, technologies such as the sidewall manufacturing process technology to form a pattern in dimensions less than the resolution limit of a exposure light have been adopted. In the sidewall manufacturing process, a hard mask is formed by forming a sidewall pattern less than the resolution limit on the sidewall of a film pattern to be a core and removing the core. Thus, if a mark pattern is formed by the above method, only a sidewall pattern in an edging shape surrounding a core is obtained in the end because even if a film pattern of the core having a mark shape is formed in dimensions equal to the resolution limit or more, the film pattern of the core is removed thereafter. Moreover, such a sidewall pattern in the edging shape has dimensions less than the resolution limit of a measuring light, posing a problem of measuring difficulty by an optical microscope using the a measuring light.

BRIEF DESCRIPTION OF THE DRAWINGS

FIGS. 6A to 6C are process top views showing an example of the pattern of the mark region according to the first embodiment;

FIGS. 12A and 12B are process sectional views of the method for fabricating a semiconductor device according to the second embodiment;

FIGS. 16A and 16B are top view showing an example of the pattern formed in the mark region of the photo mask according to a fourth embodiment;

FIG. 17 is a diagram showing an example of a superposition measuring mark in each embodiment.

DETAILED DESCRIPTION

First Embodiment

A photo mask for exposing according to an embodiment includes a mark pattern and a regular pattern. The mark pattern is arranged in a mark region that is different from an effective region to form a semiconductor device. The regular pattern is arranged in the mark region and around the mark pattern and smaller than the mark pattern in size and pitch.

A method for fabricating a semiconductor device, according to an embodiment includes forming a first film pattern, the first film pattern having a mark pattern arranged in a mark region that is different from an effective region to form a semiconductor device and a regular pattern arranged in the mark region and around the mark pattern and smaller than the mark pattern in size and pitch, on a substrate, forming a second film pattern on a sidewall of the first film pattern, and removing the first film pattern.

The first embodiment will be described below using the drawings.

Figure 1:
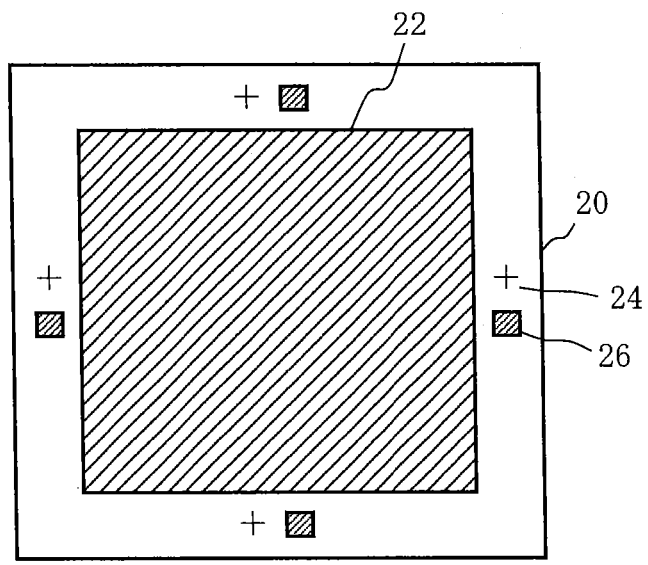
FIG. 1 is a top view showing an example of a photo mask according to a first embodiment.

In FIG. 1, a top view showing an example of a photo mask according to the first embodiment is shown. In FIG. 1, a circuit pattern of a semiconductor device is formed in an effective region 22 of a photo mask 20 according to the first embodiment. Also, an alignment mark 24 and a superposition measuring mark 26 are formed in positions different from the effective region 22, for example, in a plurality of positions outside the effective region 22. The region where the alignment mark 24 is formed becomes an alignment mark region. Similarly, the region where the superposition measuring mark 26 is formed becomes a superposition measuring mark region. In FIG. 1, an example in which the alignment mark 24 and the superposition measuring mark 26 are each formed in four positions is shown.

Figure 2:
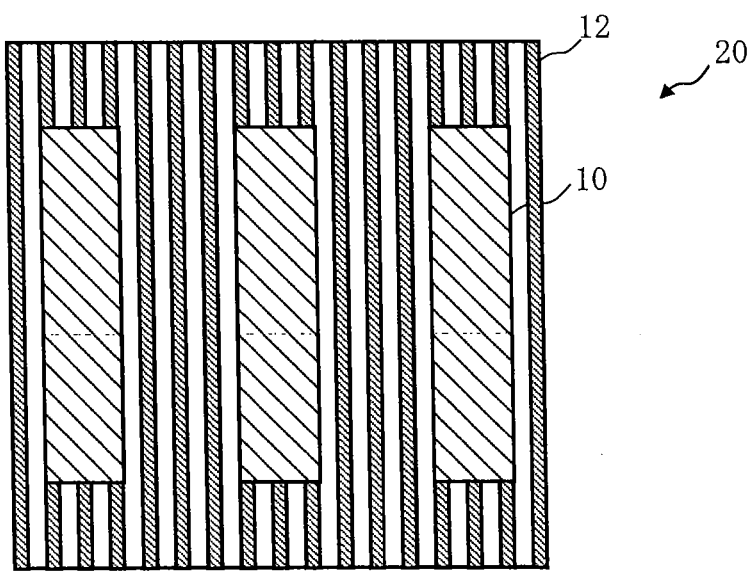
FIG. 2 is a top view showing an example of a pattern formed in a mark region of the photo mask according to the first embodiment.

In FIG. 2, a top view showing an example of a pattern formed in a mark region of the photo mask according to the first embodiment is shown. In FIG. 2, an example of the pattern formed regarding at least one of the alignment mark 24 and the superposition measuring mark 26 is shown. In FIG. 2, a convex (line pattern) mark pattern 10 and a line and space pattern 12 arranged to surround the mark pattern 10 are formed in at least one of the alignment mark region and the superposition measuring mark region of the photo mask 20. The line and space pattern 12 is formed as a pattern of, for example, line width:space width=1:1. The line and space pattern 12 is also formed in a line width dimension and pitch smaller than those of the mark pattern 10. The line and space pattern 12 is suitably formed in dimensions that become less than the resolution limit of the exposure light or the measuring light for pattern measurement when, for example, dimensions of the corresponding pattern formed on the substrate after exposure are halved. For example, the line and space pattern 12 is suitably formed in dimensions formed on the substrate after exposure of 40 nm in line width and 80 nm in pitch. On the other hand, the mark pattern 10 is formed in dimensions sufficiently more than the resolution limit of the exposure light or the measuring light for pattern measurement after subtracting, for example, ½ of dimensions of the pattern on the substrate corresponding to the line and space pattern 12. For example, the mark pattern 10 is formed in the line width of 1 to 2 μm. In FIG. 2, the mark pattern 10 has a dimension of 2.5 pitches of the line and space pattern 12, but may also be formed in a line width of more pitches. This also applies to each diagram below.

Figure 3:
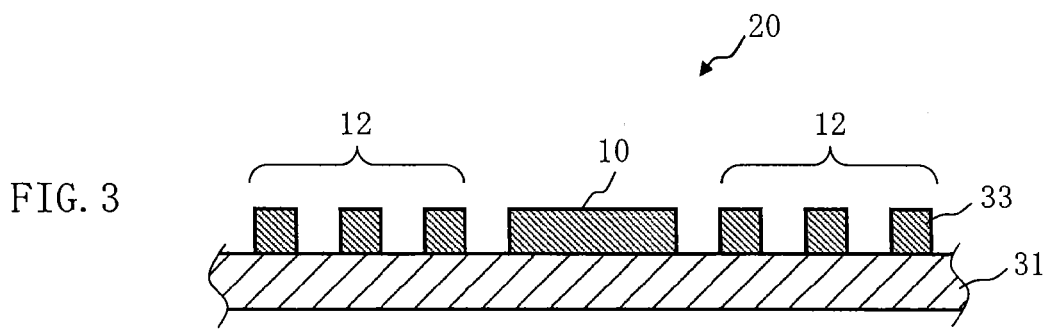
FIG. 3 is a sectional view of the mark region of the photo mask according to the first embodiment.

In FIG. 3, a sectional view of the mark region of the photo mask according to the first embodiment is shown. The photo mask 20 has a film pattern by a light-shielding film 33 formed on a glass substrate 31. The mark pattern 10 and the line and space pattern 12 described above are formed by the light-shielding film 33. As the light-shielding film 33, for example, a chrome (Cr) film is suitable. The photo mask 20 may have any other configuration as long as the mark pattern 10 and the line and space pattern 12 arranged by surrounding the mark pattern 10 are formed. For example, the photo mask 20 may be a half-tone phase mask.

Though not illustrated, a circuit pattern is formed in the effective region 22 of the photo mask 20 in size and pitch similar to those of the line and space pattern 12. That is, a line and space pattern for circuit to form a semiconductor device is formed in the effective region 22. The line and space pattern 12 in the mark region is suitably formed in substantially the same size and pitch as those of a line and space pattern for circuit formed in the effective region 22.

By exposing and transferring a pattern for the alignment mark 24 or the superposition measuring mark 26 to a semiconductor substrate by using the photo mask 20, as will be described later, a concave mark pattern that can be measured by an optical microscope can be formed even if the mark pattern is formed by using a technology that forms a pattern in dimensions less than the resolution limit of the exposure light.

Figure 4:
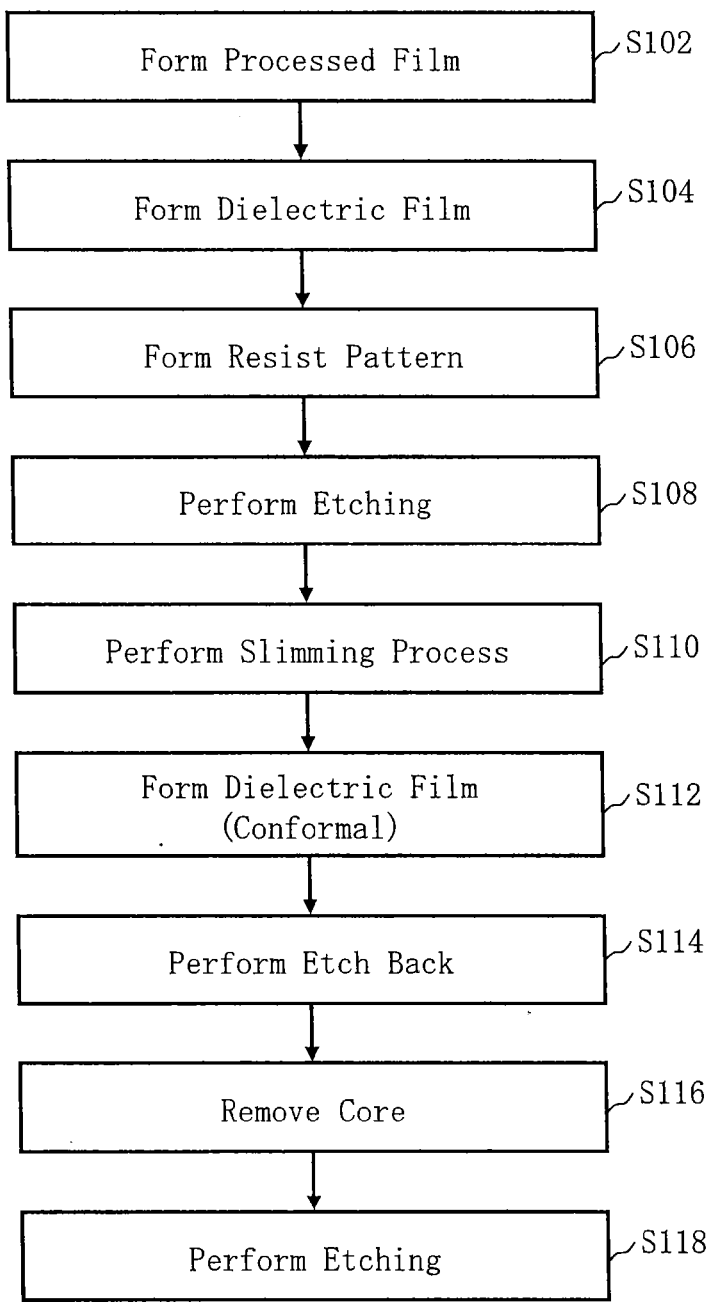
FIG. 4 is a flow chart showing principal processes of a method for fabricating a semiconductor device according to the first embodiment.

FIG. 4 is a flow chart showing principal processes of a method for fabricating a semiconductor device according to the first embodiment. The method for fabricating a semiconductor device according to the first embodiment performs a series processes including a processed film formation process (S102), a dielectric film formation process (S104), a resist pattern formation process (S106), an etching process (S108), a slimming process (S110), a dielectric film formation process (S112), an etch back process (S114), a core removal process (S116), and an etching process (S118).

In FIGS. 5A to 5D, process sectional views of the method for fabricating a semiconductor device according to the first embodiment are shown. FIGS. 5A to 5D show the processed film formation process (S102) to the dielectric film formation process (S112) in FIG. 4. The subsequent processes will be described later.

Figure 5A:
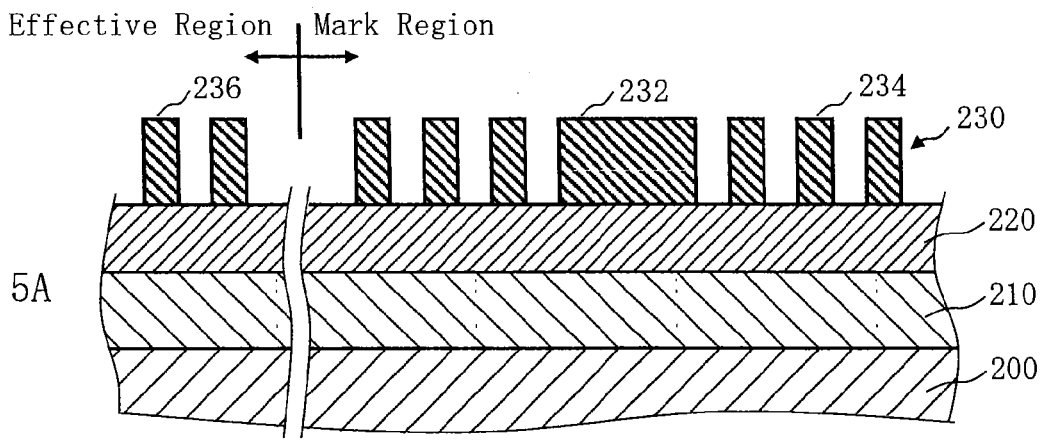
FIGS. 5A to 5D are process sectional views of the method for fabricating a semiconductor device according to the first embodiment.

In FIG. 5A, first as the processed film formation process (S102), a processed film 210 is formed on a semiconductor substrate 200 (an example of the substrate) to a thickness of, for example, 200 nm. The processed film 210 becomes a portion to form a circuit of the semiconductor device in the effective region and an alignment mark or superposition measuring mark in the mark region.

Next, as the dielectric film formation process (S104), a dielectric film 220 is formed on the processed film 210 to a thickness of, for example, 200 nm. The dielectric film 220 is used as a hard mask material when the processed film 210 is etched. A silicon oxide film ($SiO_2$ film) or the like is suitable as the dielectric film 220. For example, a TEOS (tetraethoxy silane) film is suitable.

Then, as the resist pattern formation process (S106), a resist film 230 is formed on the dielectric film 220 and a mask pattern of the photo mask 20 is exposed and transferred to the resist film 230 by using the photo mask 20 described above. Then, a resist pattern corresponding to the mask pattern is formed on the dielectric film 220 by performing development process. As the resist pattern, a convex mark pattern 232 and a line and space pattern 234 arranged around the mark pattern 232 and smaller than the mark pattern 232 in size and pitch are formed in the mark region of the semiconductor substrate 200. In the effective region of the semiconductor substrate 200, on the other hand, a circuit pattern including a line and space pattern 236 to form a semiconductor device is formed. The mark pattern 232 and the line and space pattern 234 formed in the mark region have shapes corresponding to the mark pattern 10 and the line and space pattern 12 formed on the photo mask 20. The line and space pattern 234 in the mark region is suitably formed in a line width (size) and pitch similar to those of the line and space pattern 236 in the effective region. The line and space patterns 234, 236 are formed by exposure and so are formed in a size equal to the resolution limit of the exposure light or more that can still be transferred from the photo mask 20. For example, the line and space patterns 234, 236 are formed in the wire width of 40 nm and the pitch of 80 nm. The mark pattern 232 is formed in dimensions larger than those of the line and space pattern 234, for example, in the line width of 1 to 2 μm.

Figure 5B:
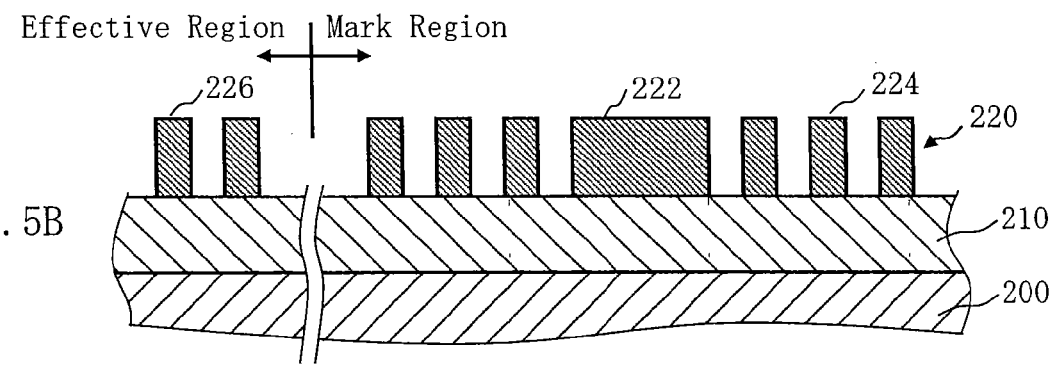

In FIG. 5B, as the etching process (S108), the dielectric film 220 in the lower layer is etched by using the formed resist pattern as a mask. Accordingly, a convex mark pattern 222 and a line and space pattern 224 arranged around the mark pattern 222 and having a size and pitch smaller than those of the mark pattern 222 are formed by the dielectric film 220 in the mark region of the semiconductor substrate 200. In the effective region of the semiconductor substrate 200, on the other hand, a circuit pattern including a line and space pattern 226 to form a semiconductor device is formed. Thus, as described above, a film pattern (an example of a first film pattern) having the mark pattern 222 and the line and space pattern 224 by the dielectric film 220 is formed. Because the line and space pattern 224 in the mark region is etched by using the above resist pattern as a mask, the line and space pattern 224 has a line width (size) and pitch similar to those of the line and space pattern 226. The line and space patterns 224, 226 are formed in a size equal to the resolution limit of the exposure light or more that can still be transferred from the photo mask 20. For example, the line and space patterns 224, 226 are formed in the wire width of 40 nm and the pitch of 80 nm. The mark pattern 222 is formed in dimensions larger than those of the line and space pattern 224, for example, in the line width of 1 to 2 μm.

In FIGS. 6A to 6C, process top views showing an example of the pattern of the mark region according to the first embodiment are shown. As shown in FIG. 6A, the convex mark pattern 222 by the dielectric film 220 corresponding to the convex mark pattern 10 (line pattern) formed on the photo mask 20 and shown in FIG. 2 and the line and space pattern 224 by the dielectric film 220 corresponding to the line and space pattern 12 shown in FIG. 2 are formed.

Figure 5C:
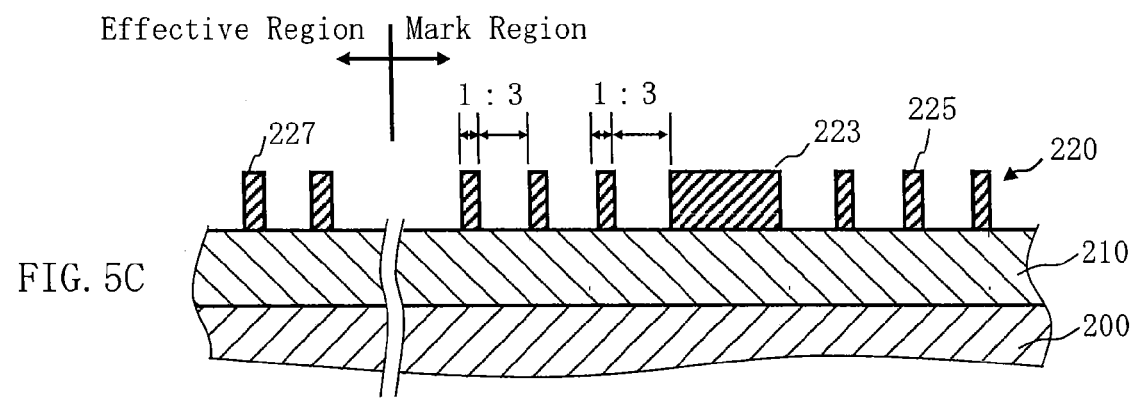

In FIG. 5C, as the slimming process (S110), the mark pattern 222 and the line and space patterns 224, 226 are etched back for slimming and the line pattern of the line and space patterns 224, 226 is processed so that the line width dimension is reduced to, for example, half the size. At this point, the line width of the mark pattern 222 is also made slimmer in the same proportion of ½ of the line width dimension of the line and space patterns 224, 226. With the slimming processing described above, a line and space pattern 225 of 1:3 can be formed around a mark pattern 223 slimmed from the mark pattern 222. Also in the effective region, it is needless to say that a line and space pattern 227 of 1:3 is similarly formed.

Figure 5D:
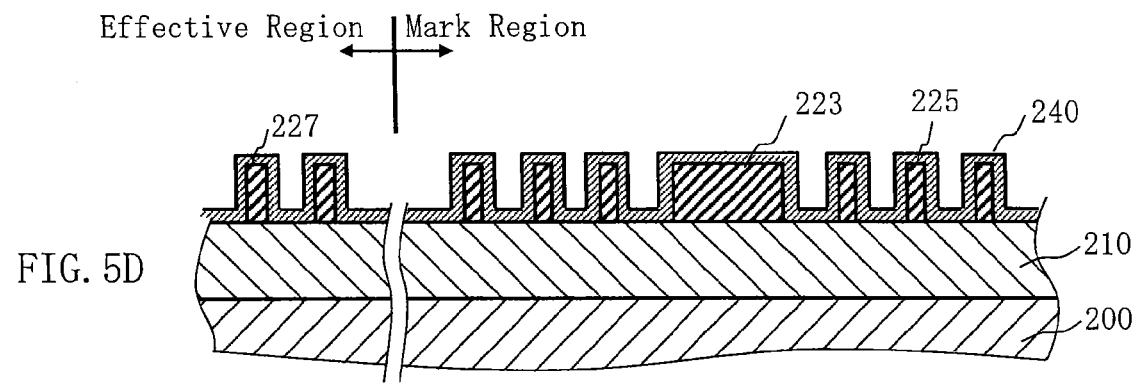

In FIG. 5D, as the dielectric film formation process (S112), a dielectric film 240 is conformally formed by using, for example, the chemical vapor deposition (CVD) method as if to cover the film pattern by the dielectric film 220 having the mark pattern 223 and the line and space pattern 225. A material having sufficient etching resistance to the dielectric film 220 is suitable as the dielectric film 240. For example, amorphous silicon (a-Si) or silicon nitride (SiN) is suitable as the dielectric film 240.

Figure 7A:
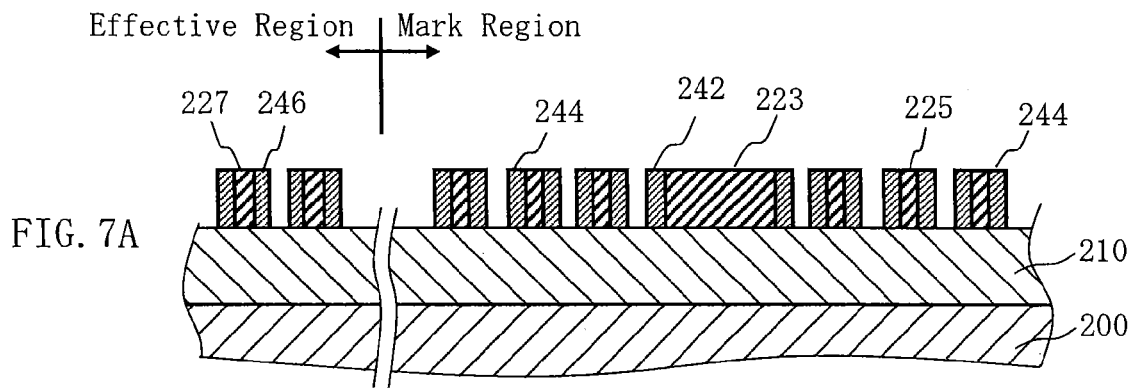
FIGS. 7A to 7C are process sectional views of the method for fabricating a semiconductor device according to the first embodiment.
Figure 7B:
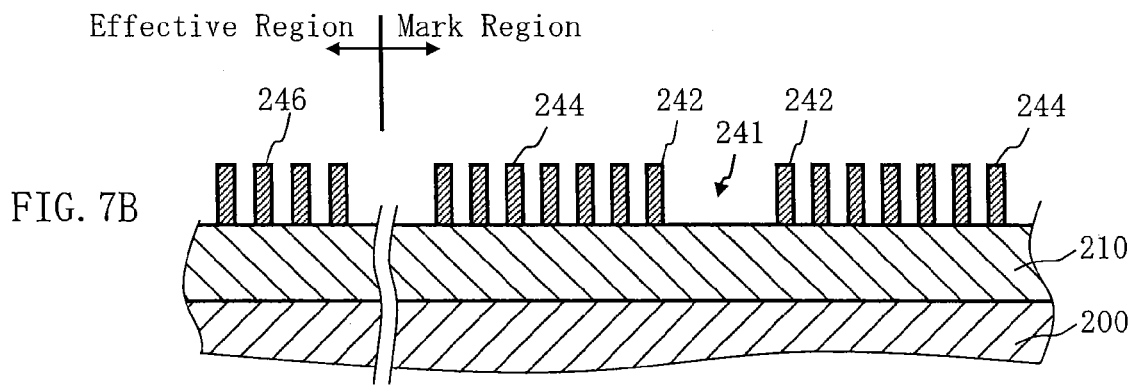
Figure 7C:
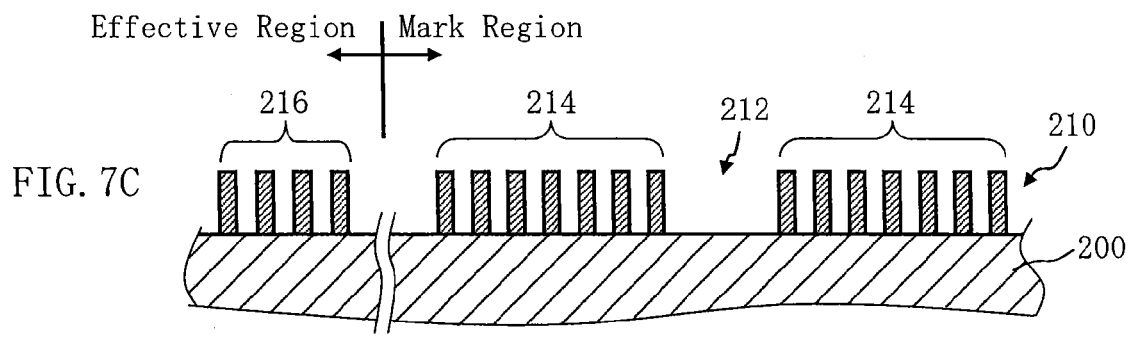

In FIGS. 7A to 7C, process sectional views of the method for fabricating a semiconductor device according to the first embodiment are shown. FIGS. 7A to 7C show the etch back process (S114) to the etching process (S118) in FIG. 4.

In FIG. 7A, as the etch back process (S114), sidewall patterns 242, 244, 246 as a film pattern (second film pattern) by the dielectric film 240 can be formed on the sidewall of the film pattern by the dielectric film 220 by etching back the dielectric film 240 until the surface of the film pattern by the dielectric film 220 is exposed. The sidewall pattern 242 is formed on both sides of the mark pattern 223. The sidewall pattern 244 is formed on both sides of a line pattern of the line and space pattern 225. The sidewall pattern 246 is formed on both sides of a line pattern of the line and space pattern 227. When viewed from the top surface, as shown in FIG. 6B, the sidewall pattern 242 is formed by being in contact with and surrounding the mark pattern 223 to be a core. Similarly, the sidewall pattern 244 is formed by being in contact with and surrounding a line pattern of the line and space pattern 225 to be a core. Similarly, the sidewall pattern 246 is formed by being in contact with and surrounding a line pattern of the line and space pattern 227 to be a core.

In FIG. 7B, as the core removal process (S116), the mark pattern 223 by the dielectric film 220 as a core in contact with and supporting the sidewall pattern 242, the line pattern of the line and space pattern 225 by the dielectric film 220 as a core in contact with and supporting the sidewall pattern 244, and the line pattern of the line and space pattern 227 by the dielectric film 220 as a core in contact with and supporting the sidewall pattern 246 are removed. In other words, the film pattern (first film pattern) by the dielectric film 220 on the substrate is removed. For example, the film pattern may be removed by wet etching. By the process as described above, a concave mark pattern 241 can be formed between the sidewall patterns 242 in the mark region. Further, a plurality of the sidewall patterns 244 constituting the pattern of line width: space width=1:1 is arranged around the concave mark pattern 241 so that the sidewall 242 also constitutes such a line and space pattern. The concave mark pattern 241 has the same width as the mark pattern 223 and can thus be formed in a width dimension larger than the wavelength of the exposure light and a measuring light for pattern measurement, that is, equal to the resolution limit or more. On the other hand, a plurality of the sidewall patterns 242, 244 constituting a line and space pattern therearound has substantially the same width as the line pattern of the line and space pattern 225 and thus can be formed in a width dimension and pitch smaller than the wavelength of the exposure light and the measuring light for pattern measurement, that is, less than the resolution limit.

In FIG. 7C, as the etching process (S118), the processed film 210 is etched by using a plurality of the sidewall patterns 242, 244 constituting the line and space pattern around the concave mark pattern 241 and a plurality of the sidewalls 246 constituting the pattern of line width:space width=1:1 in the effective region as hard masks. Accordingly, a concave mark pattern 212 formed in a width dimension larger than the wavelength of the exposure light and the measuring light for pattern measurement, that is, equal to the resolution limit or more and a pattern 214 of line width:space width=1:1 arranged around the concave mark pattern 212 in a width dimension and pitch less than the resolution limit are formed. When viewed from the top surface, as shown in FIG. 6C, the concave mark pattern 212 and the line and space pattern 214 around the concave mark pattern 212 are arranged. Like a line and space pattern 216 of line width:space width=1:1 formed in the effective region, the line and space pattern 214 is arranged in a width dimension and pitch less than the resolution limit and thus, it is difficult to identify a detailed shape of the pattern by the exposure light or the measuring light. In other words, the region where the line and space pattern 214 is formed is detected in a halftone of black and white. On the other hand, the concave mark pattern 212 is formed in a width dimension equal to the resolution limit or more and thus can be detected as a concave pattern (white pattern: no pattern) in the halftone line and space pattern 214.

Figure 8A:
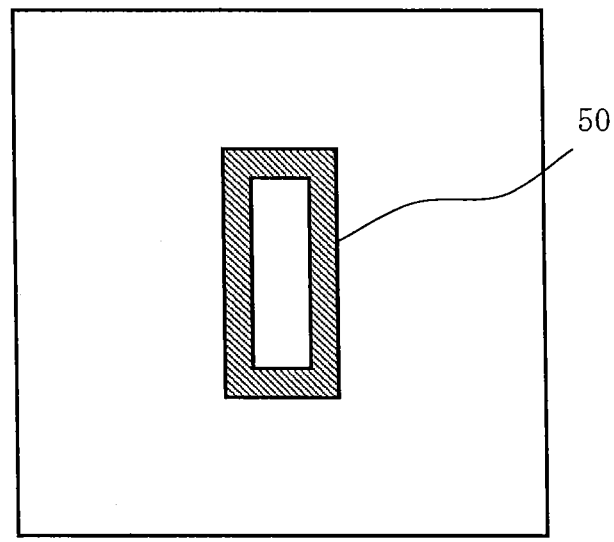
FIGS. 8A and 8B are conceptual diagrams showing a mark pattern according to the first embodiment and a concave mark pattern according to a conventional method.
Figure 8B:
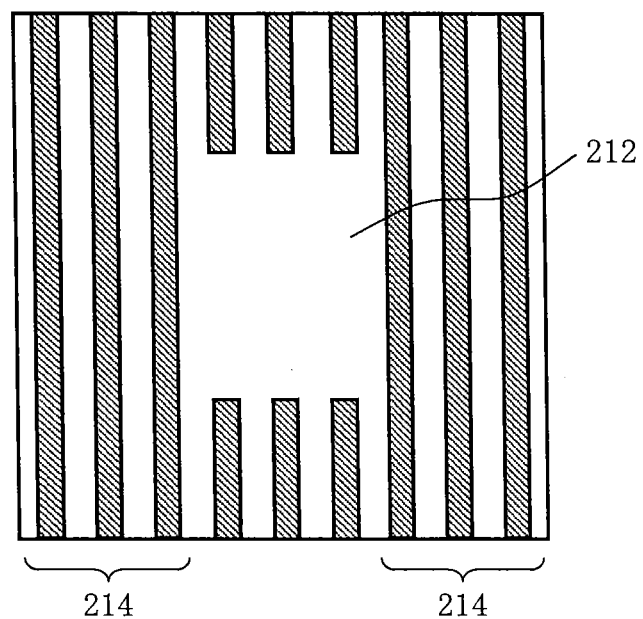

In FIGS. 8A and 8B, conceptual diagrams showing a mark pattern according to the first embodiment and a concave mark pattern according to a conventional method are shown. If, as shown in FIG. 8A, a concave mark pattern according to a conventional method is formed by using a sidewall manufacturing process, only a sidewall pattern 50 in an edging shape surrounding a core is obtained in the end because even if a film pattern of the core having a mark shape is formed in dimensions equal to the resolution limit or more, the film pattern of the core is removed thereafter. Moreover, the sidewall pattern 50 in the edging shape has dimensions less than the resolution limit and thus, it is difficult to measure by an optical microscope. In the first embodiment, by contrast, as shown in FIG. 8B, the concave mark pattern 212 in a width dimension equal to the resolution limit or more and the line and space pattern 214 in a width dimension and pitch less than the resolution limit around the concave mark pattern 212 are formed. Accordingly, even when the mark pattern 212 is formed by using a technology that forms a pattern in dimensions less than the resolution limit of the exposure light, the mark pattern 212 can be detected as a concave pattern (white pattern: no pattern) in the halftone line and space pattern 214. Thus, the concave mark pattern 212 that can be detected by the exposure light and measured by an optical microscope using the measuring light can be formed.

When a pattern is formed by performing a sidewall manufacturing process, a plurality of sidewall patterns of microdimensions may be collected for segmentation to use the collected sidewall patterns as a mark, but a sidewall pattern can be formed only as a convex type due to the nature of the process and in this case, the segmented mark also becomes a convex mark pattern.

Figure 9A:
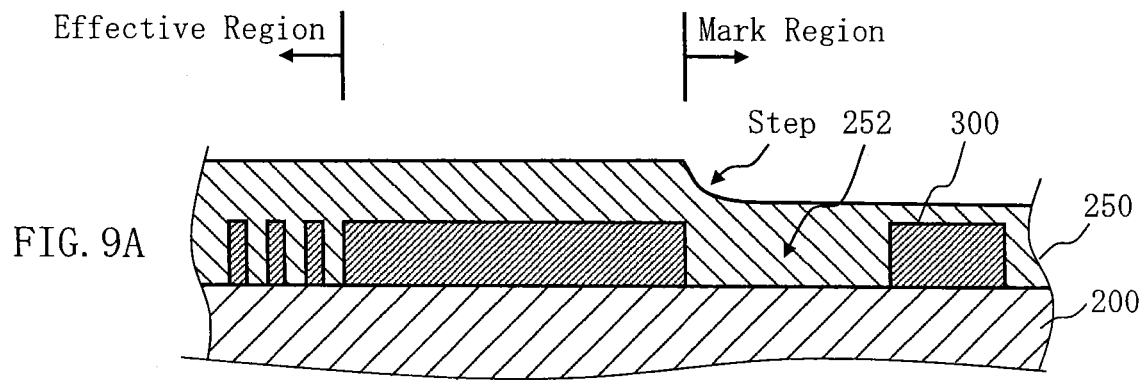
FIGS. 9A and 9B are conceptual diagrams showing cases of forming a concave mark pattern and a convex mark pattern respectively for comparison.
Figure 9B:
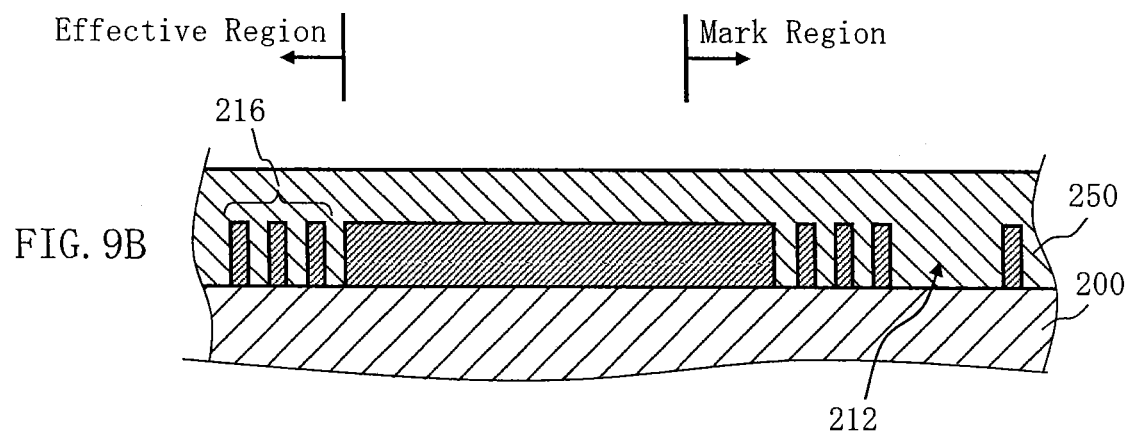

FIGS. 9A and 9B are conceptual diagrams showing cases of forming a concave mark pattern and a convex mark pattern respectively for comparison. When, as shown in FIG. 9A, a convex mark pattern 300 is formed, if a large non-pattern region (space region) 252 is present in the mark region, a step is formed between a non-pattern region 252 and a region (for example, the side of the effective region) adjacent to the non-pattern region 252 when a film 250 is formed as an upper layer on the convex mark pattern 300. If a step is present, the focusing position is shifted so that, for example, a circuit pattern in the effective region is blurred. Moreover, if a step is present, the depth of an opening changes when the opening is formed. According to the first embodiment, by contrast, as shown in FIG. 9B, the concave mark pattern 212 can be formed so that the formation of such a step can be prevented.

In the above example, the line and space pattern 214 of half the size of a line and space pattern corresponding to a mask pattern is formed by performing the sidewall manufacturing process once, but the present embodiment is not limited to such an example.

Figures 10A, 10B:
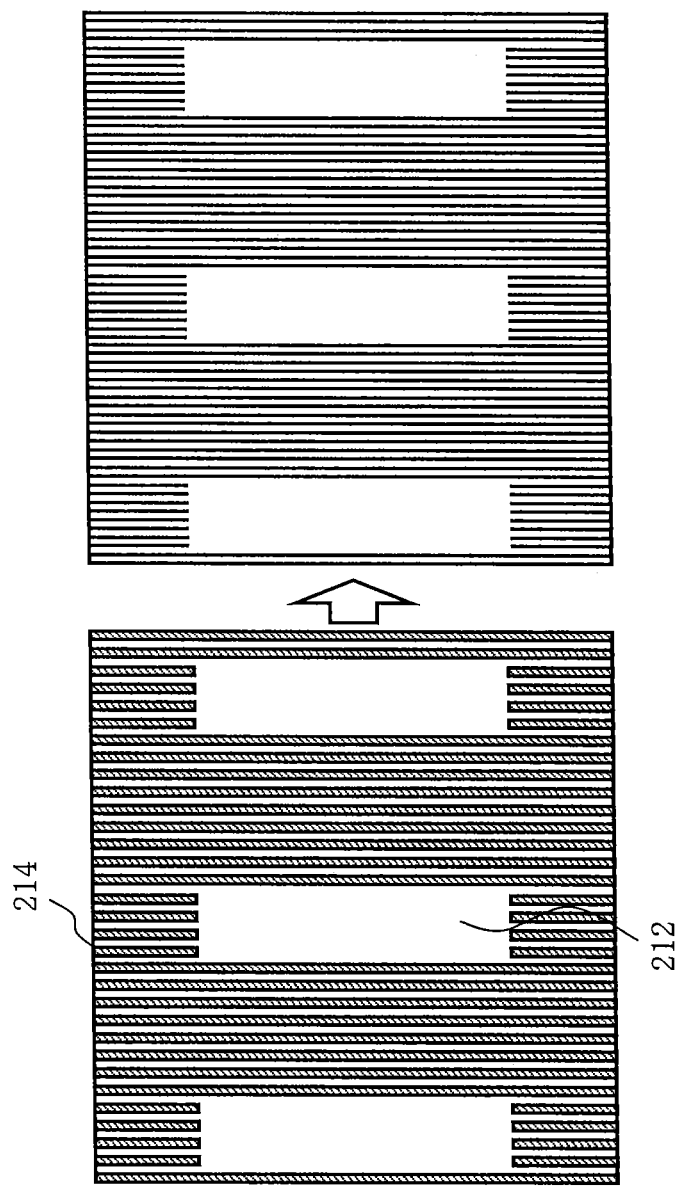
FIGS. 10A and 10B are process top views showing an example of the pattern of the mark region according to the first embodiment.

In FIGS. 10A and 10B, process top views showing an example of the pattern of the mark region according to the first embodiment are shown. In FIG. 10A, as shown in FIG. 6C, a state in which the concave mark pattern 212 is surrounded by the line and space pattern 214 of half the size of a line and space pattern corresponding to a mask pattern is shown. In such a state, the second sidewall manufacturing process is further performed to slim a line pattern of the line and space pattern 214 like the slimming process (S110). Then, the state shown in FIG. 10B can be formed by performing the dielectric film formation process (S112), the etch back process (S114), and the core removal process (S116). Accordingly, a state in which a concave mark pattern is surrounded by a line and space pattern of ¼ the size of a line and space pattern corresponding to a mask pattern may be formed. The line width and pitch are made narrower to ¼ the initial dimensions by performing the sidewall manufacturing process twice, but the present embodiment is not limited to such an example and the same process may be repeated to make the line width and pitch still narrower. This also applies to the effective region.

Second Embodiment

In the first embodiment, a case where the convex mark pattern 10 (line pattern) and the line and space pattern 12 of, for example, line width:space width=1:1 arranged as if to surround the mark pattern 10 are formed in the mark region of the photo mask 20 is described. However, embodiments are not limited to such a configuration. In a second embodiment, a photo mask on which a concave mark pattern (space pattern) is formed and a method for fabricating a semiconductor device by using the photo mask will be described. The configuration of a photo mask is the same as in FIG. 1. Each process of the method for fabricating a semiconductor device is the same as in FIG. 4. Content other than specifically described below is the same as in the first embodiment.

Figure 11:
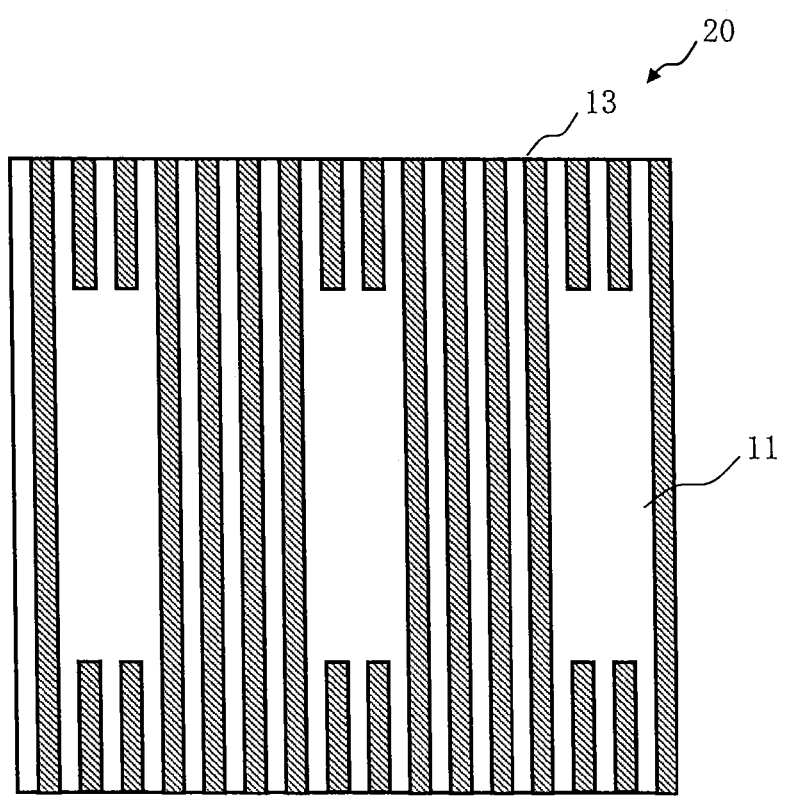
FIG. 11 is a top view showing an example of the pattern formed in the mark region of the photo mask according to a second embodiment.

In FIG. 11, a top view showing an example of the pattern formed in the mark region of the photo mask according to the second embodiment is shown. In FIG. 11, an example of the pattern formed regarding at least one of the alignment mark 24 and the superposition measuring mark 26 is shown. In FIG. 11, a concave mark pattern 11 (space pattern) and a line and space pattern 13 arranged to surround the mark pattern 11 are formed in at least one of the alignment mark region and the superposition measuring mark region of the photo mask 20. The line and space pattern 13 is formed as a pattern of, for example, line width:space width=1:1. The line and space pattern 13 is also formed in a line width dimension and pitch smaller than those of the mark pattern 11. The line and space pattern 13 is formed in dimensions that become less than the resolution limit of the exposure light or the measuring light for pattern measurement when, for example, dimensions of the corresponding pattern formed on the substrate after exposure are halved. For example, the line and space pattern 13 is formed in dimensions formed on the substrate after exposure of 40 nm in line width and 80 nm in pitch. On the other hand, the mark pattern 11 is formed in dimensions sufficiently more than the resolution limit of the exposure light or the measuring light for pattern measurement after subtracting, for example, ½ of dimensions of the pattern on the substrate corresponding to the line and space pattern 13. For example, the mark pattern 11 is formed in the line width of 1 to 2 μm. In FIG. 11, the mark pattern 11 has a dimension of 2.5 pitches of the line and space pattern 13, but may also be formed in a line width of more pitches. This also applies to each diagram below.

In FIGS. 12A and 12B, process sectional views of the method for fabricating a semiconductor device according to the second embodiment are shown. FIGS. 12A and 12B show the processed film formation process (S102) to the etching process (S118) in FIG. 4. First, the processed film formation process (S102) to the dielectric film formation process (S104) are the same as in the first embodiment.

In FIG. 12A, as the resist pattern formation process (S106), the resist film 230 is first formed on the dielectric film 220 and then a mask pattern of the photo mask 20 is exposed and transferred to the resist film 230 by using the photo mask 20 in the second embodiment. Then, a resist pattern corresponding to the mask pattern is formed on the dielectric film 220 by performing development process. As the resist pattern, a concave mark pattern 233 and a line and space pattern 235 arranged around the mark pattern 233 and smaller than the mark pattern 233 in size and pitch are formed in the mark region of the semiconductor substrate 200. In the effective region of the semiconductor substrate 200, on the other hand, a circuit pattern including a line and space pattern 237 to form a semiconductor device is formed. The mark pattern 233 and the line and space pattern 235 formed in the mark region have shapes corresponding to the mark pattern 11 and the line and space pattern 13 formed on the photo mask 20 in the second embodiment. The line and space pattern 235 in the mark region is suitably formed in a line width (size) and pitch similar to those of the line and space pattern 237 in the effective region. The line and space patterns 235, 237 are formed by exposure and so are formed in a size equal to the resolution limit of the exposure light or more that can still be transferred from the photo mask 20. For example, the line and space patterns 235, 237 are formed in the wire width of 40 nm and the pitch of 80 nm. The concave mark pattern 233 is formed in dimensions larger than those of the line and space pattern 235, for example, in the line width of 1 to 2 μm. Each process from the etching process (S108) to the core removal process (S116) below is the same as in the first embodiment.

Figures 13A, 13B, 13C:
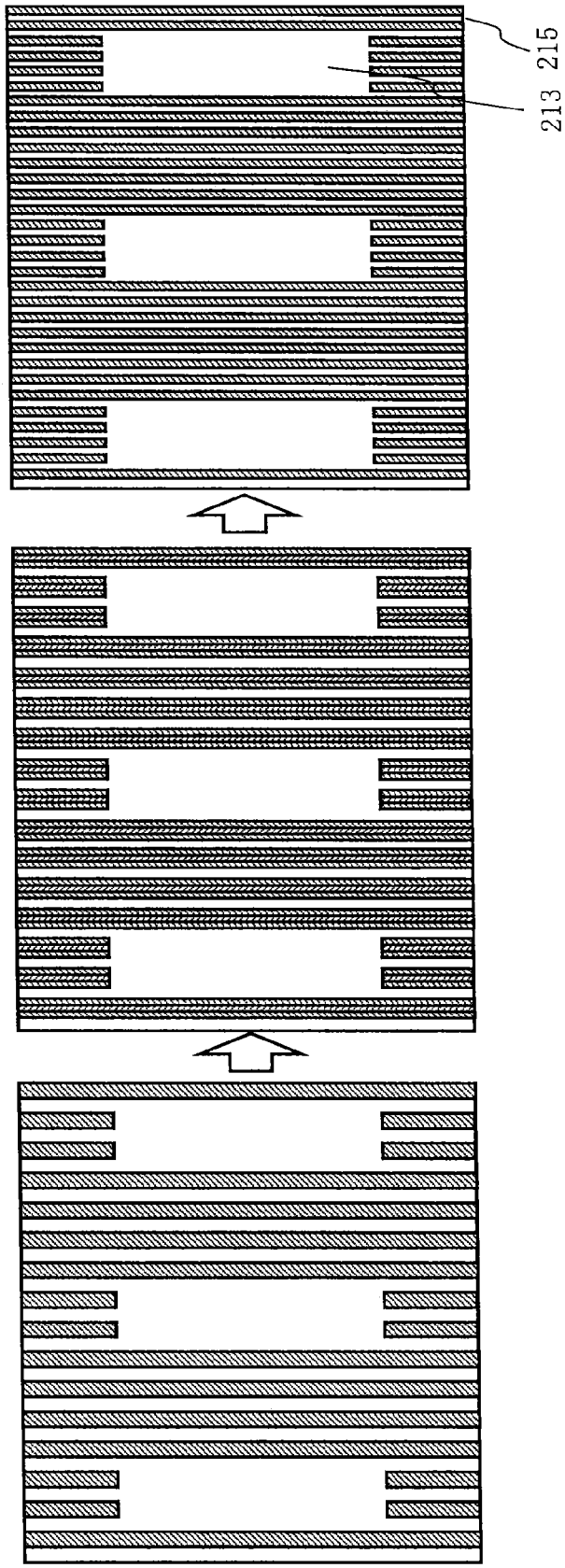
FIGS. 13A to 13C are process top views showing an example of the pattern of the mark region according to the second embodiment.

In FIGS. 13A to 13C, process top views showing an example of the pattern of the mark region according to the second embodiment are shown. As shown in FIG. 13A, a concave mark pattern by the dielectric film 220 corresponding to the concave mark pattern 11 formed on the photo mask 20 and shown in FIG. 11 and a line and space pattern by the dielectric film 220 corresponding to the line and space pattern 13 shown in FIG. 11 are formed by the etching process (S108).

As shown in FIG. 13B, a sidewall pattern is formed by the etch back process (S114) while being in contact with a line pattern to be a core of line and space patterns surrounding a concave mark pattern to surround the line pattern.

In FIG. 12B, as the etching process (S118), the processed film 210 is etched by using a plurality of sidewall patterns constituting the line and space pattern of, for example, line width:space width=1:1 around the concave mark pattern and a plurality of sidewalls constituting the line and space pattern of, for example, line width:space width=1:1 in the effective region as hard masks. Accordingly, a concave mark pattern 213 formed in a width dimension larger than the wavelength of the exposure light and the measuring light for pattern measurement, that is, equal to the resolution limit or more and a line and space pattern 215 of, for example, line width:space width=1:1 arranged around the concave mark pattern 213 in a width dimension and pitch less than the resolution limit are formed. When viewed from the top surface, as shown in FIG. 13C, the concave mark pattern 213 and the line and space pattern 215 around the concave mark pattern 213 are arranged. Like a line and space pattern 217 of line width: space width=1:1 formed in the effective region, the line and space pattern 215 is arranged in a width dimension and pitch less than the resolution limit and thus, it is difficult to identify a detailed shape of the pattern by the exposure light or the measuring light. In other words, the region where the line and space pattern 215 is formed is detected in a halftone of black and white. On the other hand, the concave mark pattern 213 is formed in a width dimension equal to the resolution limit or more and thus can be detected as a concave pattern (white pattern: no pattern) in the halftone line and space pattern 215.

Third Embodiment

In a third embodiment, a method of improving the resolution of the convex mark pattern 10 of the photo mask 20 in the first embodiment will be described.

Figures 14A, 14B:
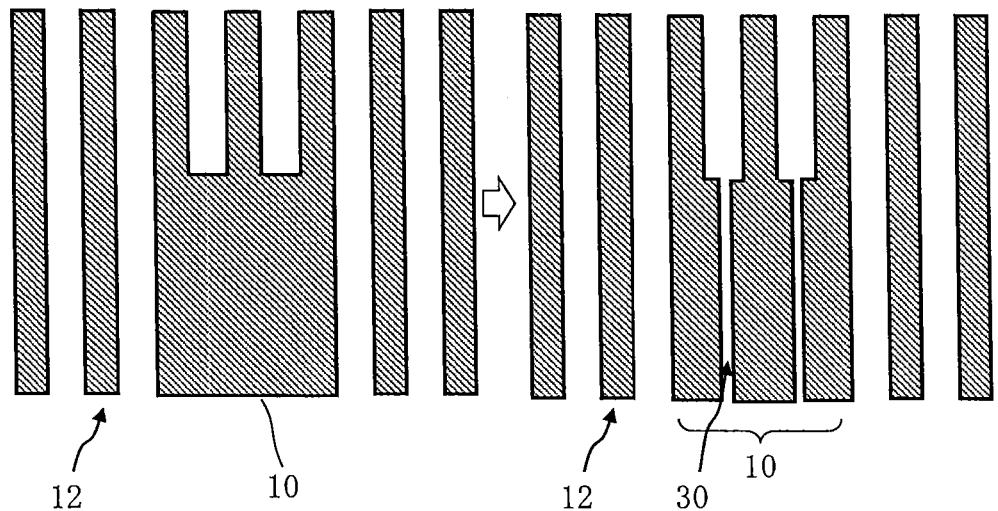
FIGS. 14A and 14B are top views showing an example of the pattern formed in the mark region of the photo mask according to a third embodiment.

In FIGS. 14A and 14B, top views showing an example of the pattern formed in the mark region of the photo mask according to the third embodiment are shown. FIG. 14A shows the convex mark pattern 10 (line pattern) in the first embodiment shown in FIG. 2 and the line and space pattern 12 of, for example, line width:space width=1:1 arranged as if to surround the mark pattern 10. In the third embodiment, as shown in FIG. 14B, a concave auxiliary pattern 30 (space pattern) having a width less than the resolution limit of the exposure light is formed on the convex mark pattern 10. The concave auxiliary pattern 30 is suitably formed in parallel with the line and space pattern 12 so as to be connected to a space portion (concave pattern:space pattern) of the line and space pattern 12 crossing the convex mark pattern 10 to extend to both sides thereof of the line and space pattern 12 surrounding the convex mark pattern 10.

Figures 15A, 15B:
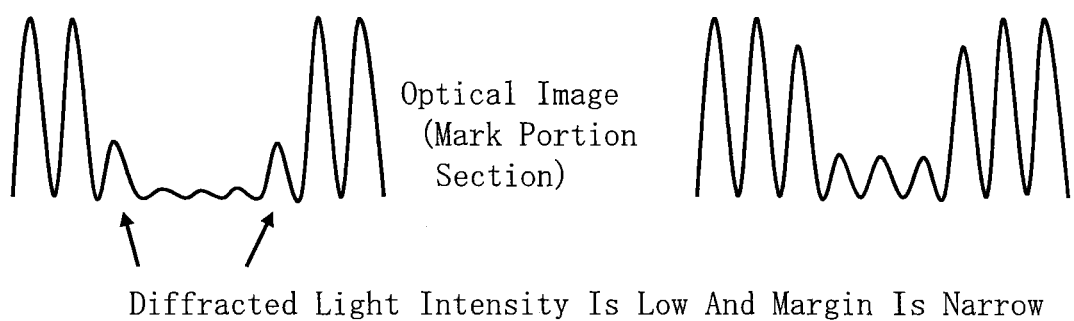
FIGS. 15A and 15B are conceptual diagrams illustrating an effect of an auxiliary pattern according to the third embodiment.

In FIGS. 15A and 15B, conceptual diagrams illustrating an effect of an auxiliary pattern according to the third embodiment are shown. If a mask pattern in which the convex mark pattern 10 with a thick line width is abruptly arranged from the line and space pattern 12 of, for example, line width:space width=1:1 is exposed and transferred to a semiconductor substrate, as shown in FIG. 15A, a diffracted light intensity difference between the convex mark pattern 10 and the neighboring line and space pattern 12 becomes small, leading to a narrower exposure margin. Thus, deviations of dimensions of the mark pattern 10 are more likely to arise. In contrast, if the concave auxiliary pattern 30 is formed on the convex mark pattern 10, changes in density of the pattern can slightly be reduced. Thus, the diffracted light intensity difference between the convex mark pattern 10 and the neighboring line and space pattern 12 can be increased. Thus, deviations of dimensions of the mark pattern 10 can be reduced. Moreover, the size of the concave auxiliary pattern 30 is less than the resolution limit of the exposure light and thus can avoid being transferred.

Thus, according to the third embodiment, deviations of dimensions of an exposed mask pattern can be reduced.

In the example of FIG. 14B, an example of the mark pattern 10 having a line width of 2.5 pitches of the line and space pattern 12 is shown, but the present embodiment is not limited to such an example and the mark pattern 10 may also be suitably formed in a line width of three pitches of the line and space pattern 12 or more. In such a case, the concave auxiliary pattern 30 does not have to be formed so as to be connected to all space portions (concave patterns) of the line and space pattern 12 crossing the convex mark pattern 10 to extend to both sides thereof. Among all space portions of the line and space pattern 12 crossing the convex mark pattern 10 to extend to both sides thereof, the concave auxiliary pattern 30 can be formed to be connected only to a space portion positioned on an edge side of the mark pattern 10. For example, it is enough to form the one to three auxiliary patterns 30 connected to one to three space portions on both edge sides of the mark pattern 10.

Fourth Embodiment

In a fourth embodiment, a method of improving the resolution of the concave mark pattern 11 of the photo mask 20 in the second embodiment will be described.

In FIGS. 16A and 16B, top views showing an example of the pattern formed in the mark region of the photo mask according to the fourth embodiment are shown. FIG. 16A shows the concave mark pattern 11 (space pattern) in the second embodiment shown in FIG. 11 and the line and space pattern 13 of, for example, line width:space width=1:1 arranged as if to surround the mark pattern 11. In the fourth embodiment, as shown in FIG. 16B, a convex auxiliary pattern 32 (line pattern) having a width less than the resolution limit of the exposure light is formed on the concave mark pattern 11. The convex auxiliary pattern 32 is suitably formed in parallel with the line and space pattern 13 so as to be connected to a line portion (convex pattern: line pattern) of the line and space pattern 13 crossing the concave mark pattern 11 to extend to both sides thereof of the line and space pattern 13 surrounding the concave mark pattern 11.

If a mask pattern in which the concave mark pattern 11 with a thick width is abruptly arranged from the line and space pattern 13 of line width:space width=1:1 is exposed and transferred to a semiconductor substrate, as shown in FIG. 15A, a diffracted light intensity difference between the concave mark pattern 11 and the neighboring line and space pattern 13 becomes small, leading to a narrower exposure margin. Thus, deviations of dimensions of the mark pattern 11 are more likely to arise. In contrast, if the convex auxiliary pattern 32 is formed on the concave mark pattern 11, changes in density of the pattern can slightly be reduced. Thus, the diffracted light intensity difference between the concave mark pattern 11 and the neighboring line and space pattern 13 can be increased. Thus, deviations of dimensions of the concave mark pattern 11 can be reduced. Moreover, the size of the convex auxiliary pattern 32 is less than the resolution limit of the exposure light and thus can avoid being transferred.

Thus, according to the fourth embodiment, deviations of dimensions of an exposed mask pattern can be reduced.

Also in the example of FIG. 16B, an example of the mark pattern 11 having a line width of 2.5 pitches of the line and space pattern 13 is shown, but the present embodiment is not limited to such an example and the mark pattern 11 may be suitably formed similarly in a line width of three pitches of the line and space pattern 13 or more. The fourth embodiment is configured by inverting concaveness and convexness of the third embodiment and thus, the description is similar to one obtained by inverting concaveness and convexness (space pattern/line pattern) in the third embodiment. That is, the convex (line pattern) auxiliary pattern 32 can be formed so as to be connected only to a line portion positioned on the edge side of the mark pattern 11 of all line portions (convex pattern: line pattern) of the line and space pattern 13 crossing the concave mark pattern 11 (space pattern) to extend to both sides thereof. For example, it is enough to form the one to three auxiliary patterns 32 connected to one to three line portions on both edge sides of the mark pattern 11.

In each of the above embodiments, a plurality of mark patterns arranged in parallel with each other and a line and space pattern arranged around the plurality of mark patterns are arranged in the mark region, but the embodiments are not limited to such an example.

In FIG. 17, a diagram showing an example of a superposition measuring mark is shown. In FIG. 17, an external square is formed by four linear mark regions and further, an internal square is formed by four linear mark regions. In each linear mark region, a pattern group constituted of the mark pattern 212 and the line and space pattern 214 surrounding the mark pattern is arranged. The superposition measuring mark can suitably be formed in such a shape. When the second embodiment or the fourth embodiment is applied, it is needless to say that a pattern group is constituted of the mark pattern 213 and the line and space pattern 215 surrounding the mark pattern.

Figure 18:
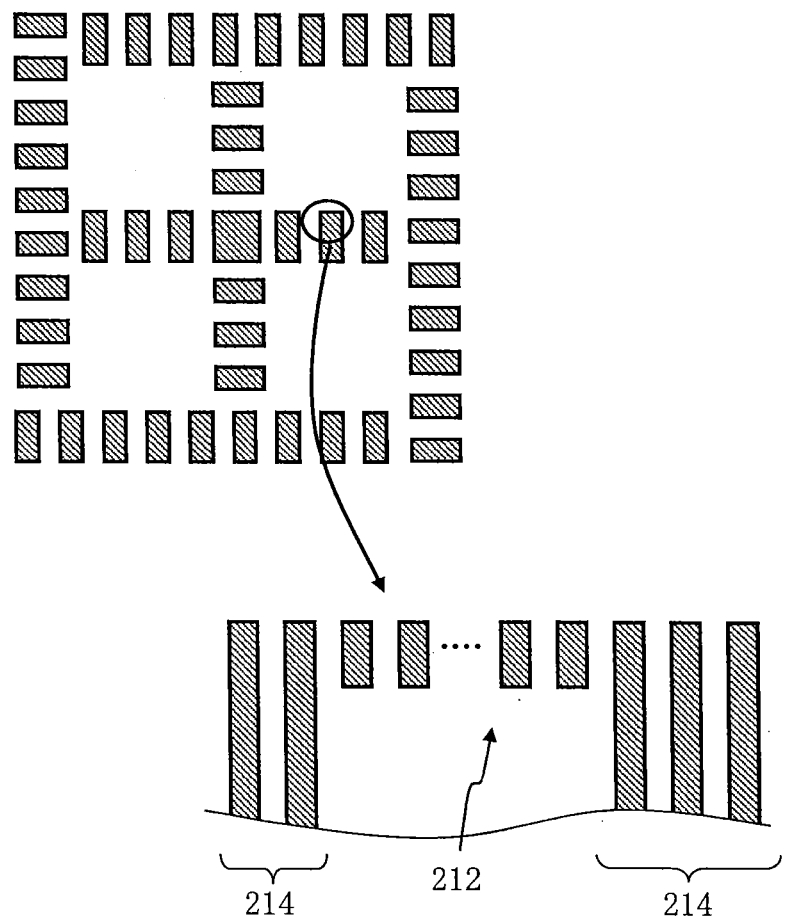
FIG. 18 is a diagram showing an example of an alignment mark in each embodiment.

In FIG. 18, a diagram showing an example of an alignment mark is shown. In FIG. 18, an external square and an internal cross are formed by a plurality of rectangular mark regions. In each rectangular mark region, a pattern group constituted of the mark pattern 212 and the line and space pattern 214 surrounding the mark pattern is arranged. The alignment mark can suitably be formed in such a shape. When the second embodiment or the fourth embodiment is applied, it is needless to say that a pattern group is constituted of the mark pattern 213 and the line and space pattern 215 surrounding the mark pattern.

The embodiments are described above with reference to the concrete examples. However, the embodiments are not limited to the concrete examples. For example, a case where a line and space pattern surrounding mark patterns is arranged to extend along the longitudinal direction of the mark pattern is shown in each embodiment, but the line and space pattern may be arranged to extend along a direction perpendicular to the longitudinal direction of mark patterns and the extending direction thereof is not specifically limited. Further, a periodical regular pattern other than the line and space pattern may be arranged in a size and pitch smaller than those of mark patterns as if to surround the mark patterns.

The thickness of an inter-level dielectric and the size, shape, and number of openings that are needed for semiconductor integrated circuits and various semiconductor elements can appropriately be selected and used.

In addition, all photo masks and methods for fabricating a semiconductor device which include the elements of the embodiments and can be attained by appropriately changing in design by a person skilled in the art are included in the spirit and scope of the embodiments.

For the simplification of description, methods normally used in the semiconductor industry, for example, cleaning before or after processing in a photolithography process, are omitted, but it is needless to say that such methods are included in the embodiments.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A photo mask for exposing comprising:
    a mark pattern arranged in a mark region that is different from an effective region to form a semiconductor device; and
    a regular pattern arranged in the mark region and around the mark pattern and smaller than the mark pattern in size and pitch,
    wherein the mark pattern includes an auxiliary pattern smaller in size than the regular pattern arranged in the mark region.

2. The photo mask according to claim 1, wherein the regular pattern is a line and space pattern.

3. The photo mask according to claim 2, wherein a circuit line and space pattern for forming the semiconductor device is formed in the effective region, and
    the regular pattern arranged the mark pattern is a line and space pattern formed in substantially the same size and pitch as the circuit line and space pattern for the circuit.

4. The photo mask according to claim 2, wherein the auxiliary pattern is formed in the mark pattern.

5. The photo mask according to claim 4, wherein the auxiliary pattern is formed in a width less than a resolution limit of a exposure light.

6. The photo mask according to claim 4, wherein a line pattern is used as the mark pattern and a space pattern is formed as the auxiliary pattern.

7. The photo mask according to claim 6, wherein the auxiliary pattern is formed so as to be connected to a space portion of the line and space pattern arranged as the regular pattern around the mark pattern.

8. The photo mask according to claim 4, wherein a space pattern is used as the mark pattern and a line pattern is formed as the auxiliary pattern.

9. The photo mask according to claim 8, wherein the auxiliary pattern is formed so as to be connected to a line portion of the line and space pattern arranged as the regular pattern around the mark pattern.

10. The photo mask according to claim 2, wherein the line and space pattern arranged around the mark pattern is formed in such a width that half a size of a dimension of a pattern corresponding to the line and space pattern formed on a substrate by exposing and transferring the line and space pattern becomes less than a resolution limit of a exposure light.

11. The photo mask according to claim 10, wherein the mark pattern is formed in such a width that a size after subtracting half the size of the dimension of the pattern corresponding to the line and space pattern from a dimension of a pattern corresponding to the mark pattern formed on the substrate by exposing and transferring the mark pattern becomes equal to the resolution limit of the exposure light or more.

12. The photo mask according to claim 2, wherein the line and space pattern arranged around the mark pattern is formed in such a width that half a size of a dimension of a pattern corresponding to the line and space pattern formed on a substrate by exposing and transferring the line and space pattern becomes less than a resolution limit of a measuring light for pattern measurement.

13. The photo mask according to claim 12, wherein the mark pattern is formed in such a width that a size after subtracting half the size of the dimension of the pattern corresponding to the line and space pattern from a dimension of a pattern corresponding to the mark pattern formed on the substrate by exposing and transferring the mark pattern becomes equal to the resolution limit of the a measuring light for pattern measurement or more.

* * * * *